United States Patent [19]

Miille

[11] 4,207,534
[45] Jun. 10, 1980

[54] FAST REDUNDANT PULSE DENSITY ANALYZER

[75] Inventor: Gerard J. Miille, Redwood City, Calif.

[73] Assignee: GTE Automatic Electric Laboratories Incorporated, Northlake, Ill.

[21] Appl. No.: 885,157

[22] Filed: Mar. 10, 1978

[51] Int. Cl.² ............... H03K 5/20; H03K 19/32; H03K 13/32
[52] U.S. Cl. ............... 328/147; 307/359; 307/216; 307/219
[58] Field of Search ............... 328/146, 147; 307/358, 307/359, 219, 204, 216

[56] References Cited

U.S. PATENT DOCUMENTS

| | | | |
|---|---|---|---|
| 3,074,639 | 1/1963 | Morgan et al. | 307/216 X |
| 3,600,606 | 8/1971 | Clor | 328/147 X |
| 3,803,425 | 4/1974 | Carp | 307/219 |
| 3,851,259 | 11/1974 | Porawski | 328/147 X |
| 4,065,721 | 12/1977 | Rabe | 307/358 X |
| 4,127,813 | 11/1978 | Hiroshima et al. | 328/147 X |

*Primary Examiner*—John S. Heyman
*Attorney, Agent, or Firm*—Leonard R. Cool

[57] ABSTRACT

A self-checking pulse density analyzer includes substantially similar first and second threshold detection circuits, each of which have one input connected to receive incoming pulse information to be analyzed, and each of which provide the same binary signal state at a separate output terminal, when the pulse density reaches a predetermined level. Each output terminal is connected to a separate input terminal of a threshold equalizing circuit and to respective inputs of first and second gating circuits. The threshold equalizing circuit is activated by the binary signal from the faster acting threshold detection circuit to speed up the operation of the slower threshold detection circuit and, thus, minimize the difference in operating time betwee the two circuits. These two nearly simultaneous binary indications cause the first gating circuit to operate and, thus, provide a particular binary output signal indicative thereof. When the binary indications are substantially separated in time, or if one does not occur, the second gating circuit is effectuated to indicate a failure of one threshold detection circuit.

8 Claims, 1 Drawing Figure

FAST REDUNDANT PULSE DENSITY ANALYZER

BACKGROUND OF THE INVENTION

1. Field of the Invention

This invention relates to pulse density analyzers which provide an output indication when the pulse density input to the analyzer reaches a certain level and, more particularly, to a self-checking analyzer which provides a continuous self-check of the pulse density analysis.

2. Description of the Prior Art

Many prior-art error pulse density analyzers use a combination of a counter and a timer, such as is disclosed in U.S. patent application Ser. No. 583,147, filed June 2, 1975, entitled "Error Density Detector". When such error detectors receive an initial error pulse, a timer is started and error pulses are counted during the timing interval. A disadvantage of this prior-art technique arises when one tries to make the circuit self-checking. Basically, one of two methods of self-checking may be used. The first method consists of periodically sending a known-density error pulse train through the density calculator and verifying whether or not an alarm signal appears at the output. This method does not verify that the circuit is reacting at the correct density threshold because its counter could be overflowing earlier than it should. The second method of self-checking involves a redundant error density analyzer circuit. Since the timers use timing components with varying manufacturing tolerances, the two timers may have slightly different time-out times. This could initiate a self-check alarm since the two circuits have different outputs even though there is no circuit failure.

SUMMARY OF THE INVENTION

A self-checking pulse density analyzer includes first and second threshold detection circuits connected so that an input terminal of each accepts the pulses to be analyzed. Each detection circuit separately and simultaneously analyzes the pulse density and provides a predetermined binary output state when a certain predetermined threshold value is obtained. The separate binary outputs from the threshold detector circuits are applied to a threshold equalizing means. The threshold equalizing means changes the threshold reference potential of the threshold detection means for both threshold detection circuits once the predetermined binary output state is obtained from the output terminal of one of the threshold detection circuits. This change in threshold reference potential causes the threshold circuit of the other threshold detection means to provide a like binary output state when the difference in the response is within that contemplated by the tolerance differences of the elements. Such a result would not occur if one of the two circuits was not opeating within the tolerance limits. The output terminals of each of the threshold detection circuits are connected to inputs of a responsive means which provides a binary output indication when both threshold detection means provide the predetermined binary state. Alternatively, the responsive means provides a separate binary output when the binary outputs of the threshold detection means are of unlike states.

DETAILED DESCRIPTION OF THE INVENTION

Figure 1:
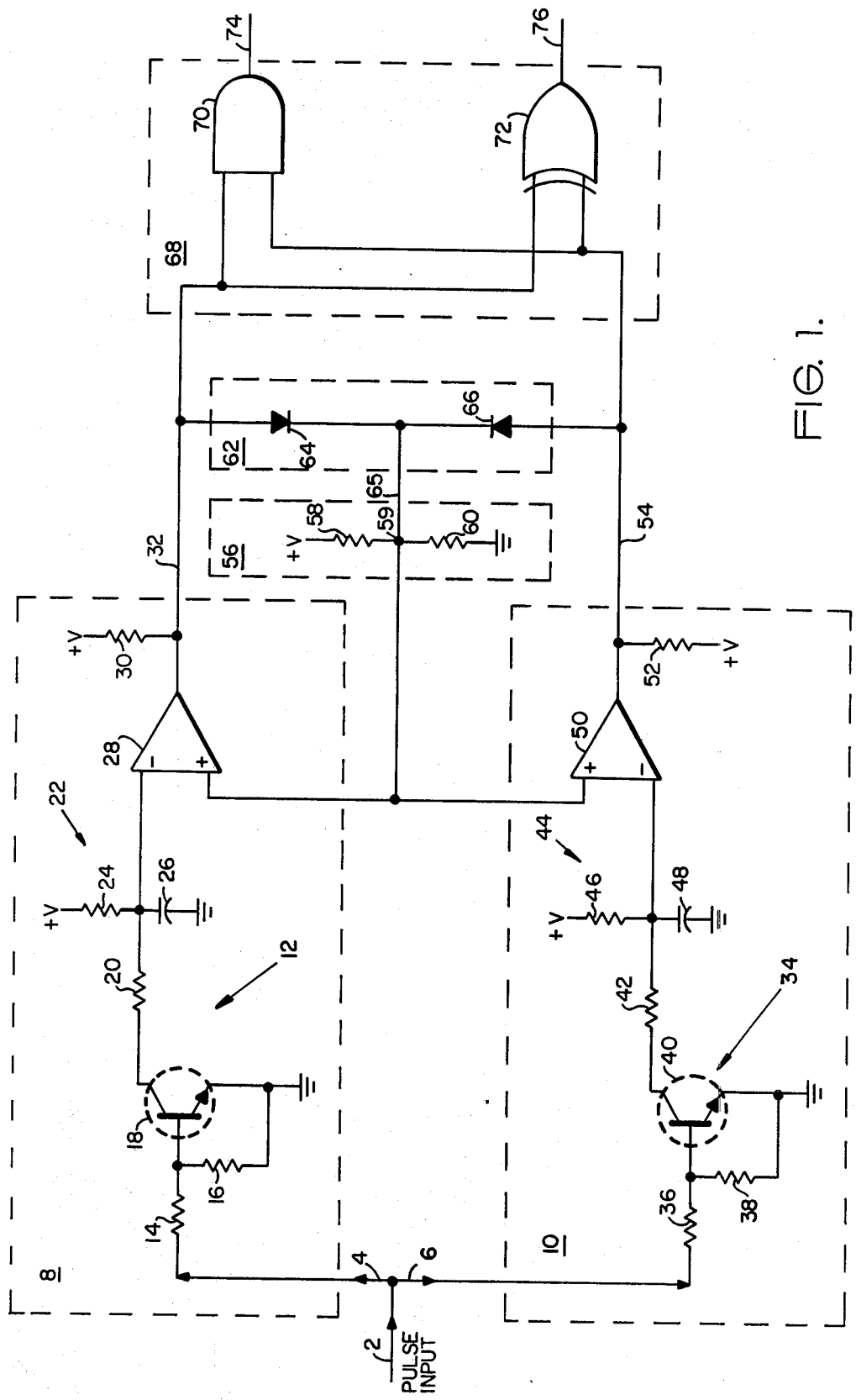
FIG. 1, the only FIGURE in the drawing, is a schematic of a preferred embodiment of applicant's invention.

Pulses enter the pulse density analyzer via path 2, and these pulses are applied essentially simultaneously to substantially similar threshold detection means 8 and 10. Since the two separate threshold detection means operate in substantially the same manner, only the arrangement shown in 8 will be described. The incoming pulses on path 4 are applied to the discharge path 12 comprising isolating resistor 14, bias resistor 16, transistor 18, and discharge resistor 20. The incoming pulses bias transistor 18 on, which connects resistor 20 to ground, thus discharging capacitor 26. When transistor 18 is turned off, i.e., no pulses appearing on path 4, capacitor 26 is charged from supply source +V via resistor 24. Because the charging and discharging paths are separate, the charging and discharging rates may be adjusted, by proper selection of resistors 20 and 24, to operate at any desired pulse density. It is apparent that the discharging rate will generally be greater than the charging rate for error detection purposes. Thus, when pulses occur frequently enough, capacitor 26 will discharge more during the occurrence of the pulses than it charges during the time between pulses, and the average voltage on capacitor 26 will begin to drop. Since this voltage is applied to the inverting input of comparator 28, when the inverting input voltage drops below the threshold reference voltage established by the potential applied to the noninverting input of the comparator 28, the comparator will switch. This inverts the binary output signal on path 32 which is an alarm or detection state. The threshold reference voltage applied to the noninverting input of comparator 28 is derived from reference source 56 by means of resistors 58 and 60 in a voltage divider arrangement connected between the source voltage +V and ground.

It is to be noted that threshold detection means 10 operates in a similar manner and, if it were to perform its function in the same time period as the threshold detection means 8, there would occur simultaneously on path 54 a binary output signal of the same binary state (detection state) as that obtained on path 32. Paths 32 and 54 are connected to alarm gating means 68 and, as shown in the drawing, each is connected to both AND-gate 70 and Exclusive-OR gate 72. If a detection state is present at paths 32 and 54 at the same time, AND-gate 70 will so indicate by providing a binary signal on output path 74. But, if one threshold detection circuit provides a detection state at its output, but the other does not, at or about the same time, the information presented to the inputs of Exclusive-OR gate 72 are unlike binary states and gate 72 will provide an output alarm indication. This alarm indication is evidence of the fact that the self-checking circuit shows that the pulse analyzer is not operating properly.

Because of the various manufacturing tolerances that could obtain for the various electrical components included in the two threshold detection means, it is apparent that operation of the arrangement, as described, could indicate that the pulse density analyzer is not operating properly even though, in fact, it is only the tolerances of the components which prevent the two threshold detection means from performing the function within the same time period. To overcome this problem, threshold equalizing means 62 is employed. The function of equalizing means 62 is to change the reference potential, which is applied to the noninverting inputs of differential amplifiers 28 and 50, so that the effective threshold differential is significantly decreased. This is accomplished by the use of resistors 30 and 52, and diodes 64 and 66, as follows. Before the incoming pulses cause threshold detector 8 to reach a threshold state, the output of differential amplifier 28 is a binary 0. In essence, it has a low voltage output signal applied to path 32 and diode 64 is back biased. Similarly, for the threshold detection circuit 10 and diode 66. When the output signal of differential amplifier 28 changes states, i.e., becomes binary 1, the voltage on path 32 swings toward +V, diode 64 is forward biased and this new voltage is applied via path 65, junction 59, as the threshold reference potential to the noninverting inputs of differential amplifiers 28 and 50. This change in threshold reference potential narrows or eliminates the difference in potential between the two inputs of the differential amplifier, i.e., lowers the threshold, and it adds hysteresis. The result is that when one comparator switches, the feedback signal raises the threshold and, if the other comparator is near the switching threshold, it, too, will now switch since the threshold has been raised. Thus, minor differences in component values will not cause any false self-test alarms. The very narrow differences in time of operation, which could result, can be eliminated with a delay which will not significantly lengthen the response time. Such an arrangement is not shown since it is considered to be known by those having skill in the art.

While the invention has been particularly shown and described with reference to a preferred embodiment thereof, it will be understood by those skilled in the art that change in form and detail may be made therein without departing from the spirit and scope of the invention.

What is claimed is:

1. A pulse density analyzer including a self-checking circuit comprising:
 a threshold reference potential having an input terminal and an output terminal;
 a first threshold detector having a first input terminal arranged to accept the pulses to be analyzed, having a second input terminal connected to the output terminal of said threshold reference potential, said first detector providing at an output terminal a binary output signal of one state when the pulse density at said input terminal reaches a predetermined threshold value;
 a second threshold detector having a first input terminal arranged to accept the pulses to be analyzed, having a second input terminal connected to the output terminal of said threshold reference potential, said second detector providing at an output terminal a binary output signal of said one state when the pulse density at said input terminal reaches said predetermined threshold value;
 a threshold equalizer having a first input terminal connected to the output terminal of said first threshold detector, having a second input terminal connected to the output terminal of said second threshold detector, and having an output terminal connected to the input terminal of said threshold reference potential, said threshold equalizer being responsive to the output signal of one of the two threshold detectors, whichever occurs first, for effecting a simultaneous change in the threshold reference potential applied to both threshold detection circuits; and
 means responsive to the output signals from said first and second threshold detectors for providing a first output indication at a first output terminal when said binary output signals are both of said one state and a second output indication at a second output terminal when said binary output signals are not of said one state.

2. The analyzer of claim 1 wherein said first threshold detector comprises:
 a first charge storage means having an input and an output;
 first means for continuously supplying charge to said first charge storage means;
 a first gating means responsive to the pulses at said first input terminal for discharging said first charge storage means at a rate greater than the charging rate; and
 a first comparator having a first input terminal connected to said threshold reference potential, a second input terminal connected to the output terminal of said charging means, and having an output terminal connected to the output terminal of said first threshold detector for providing the binary output signal at said output terminal when the charge on said charge storage means reaches a predetermined value.

3. The analyzer of claim 2 wherein said second threshold detector comprises:
 a second charge storage means having an input and an output;
 second means for continuously supplying charging current to said second charge storage means;
 a second gating means responsive to the pulses at said first input terminal for discharging said second charge storage means at a rate greater than the charging rate; and
 a second comparator having a first input terminal connected to said threshold reference potential, a second input terminal connected to the output terminal of said charging means, and having an output terminal connected to the output terminal of said second threshold detector for providing an output signal at said output terminal when the charge on said second charge storage means reaches a predetermined value.

4. Apparatus in accordance with claim 1 wherein said threshold equalizer further comprises:
 first diode means having an input terminal connected to the output terminal of said first threshold detector, and having an output terminal connected to the input terminal of said threshold reference potential; and
 second diode means having an input terminal connected to the output terminal of said second threshold detector, and having an output terminal connected to the input terminal of said threshold reference potential.

5. Apparatus in accordance with claim 3 wherein said threshold equalizer further comprises:
 first diode means having an input terminal connected to the output terminal of said first threshold detector, and having an output terminal connected to the input terminal of said threshold reference potential; and second diode means having an input terminal connected to the output terminal of said second threshold detector, and having an output terminal connected to the input terminal of said threshold reference potential.

6. Apparatus in accordance with claim 1 wherein said means responsive further comprises:

first gating means having an output terminal, having a first input terminal connected to the output terminal of said first threshold detector, and having a second input terminal connected to the output terminal of said second threshold detector, whereby a binary output signal of a predetermined state appears at said output terminal when the binary input signals on said first and second input terminals are of one like state; and second gating means having an output terminal, having a third input terminal connected to the output terminal of said first threshold detector, and having a fourth input terminal connected to the output terminal of said second threshold detector, whereby a binary output signal of a predetermined state appears at said output terminal when the binary input signals on said first and second input terminals are not of said one like state.

7. Apparatus in accordance with claim 3 wherein said means responsive further comprises:

first gating means having an output terminal, having a first input terminal connected to the output terminal of said first threshold detector, and having a second input terminal connected to the output terminal of said second threshold detector, whereby a binary output signal of a predetermined state appears at said output terminal when the binary input signals on said first and second input terminals are of one like state; and second gating means having an output terminal, having a third input terminal connected to the output terminal of said first threshold detector, and having a fourth input terminal connected to the output terminal of said second threshold detector, whereby a binary output signal of a predetermined state appears at said output terminal when the binary input signals on said first and second input terminals are not of said one like state.

8. Apparatus in accordance with claim 4 wherein said means responsive further comprises:

first gating means having an output terminal, having a first input terminal connected to the output terminal of said first threshold detector, and having a second input terminal connected to the output terminal of said second threshold detector, whereby a binary output signal of a predetermined state appears at said output terminal when the binary input signals on said first and second input terminals are of one like state; and second gating means having an output terminal, having a third input terminal connected to the output terminal of said first threshold detector, and having a fourth input terminal connected to the output terminal of said second threshold detector, whereby a binary output signal of a predetermined state appears at said output terminal when the binary input signals on said first and second input terminals are of unlike states.

* * * * *